US012696493B2

(12) United States Patent
Sueyama et al.

(10) Patent No.: US 12,696,493 B2
(45) Date of Patent: Jul. 28, 2026

(54) BOOSTER CIRCUIT FOR SEMICONDUCTOR MEMORY DEVICE

(71) Applicant: KIOXIA CORPORATION, Minato-ku (JP)

(72) Inventors: Takao Sueyama, Yokohama (JP); Naohiro Matsukawa, Yokohama (JP); Keiko Kaneda, Chiba (JP)

(73) Assignee: KIOXIA CORPORATION, Tokyo (JP)

( * ) Notice: Subject to any disclaimer, the term of this patent is extended or adjusted under 35 U.S.C. 154(b) by 106 days.

(21) Appl. No.: 18/316,610

(22) Filed: May 12, 2023

(65) Prior Publication Data

US 2023/0282747 A1 Sep. 7, 2023

Related U.S. Application Data

(62) Division of application No. 16/568,737, filed on Sep. 12, 2019, now abandoned.

(30) Foreign Application Priority Data

Dec. 19, 2018 (JP) .................................. 2018-237033

(51) Int. Cl.
*G11C 16/16* (2006.01)
*G11C 16/06* (2006.01)
(Continued)

(52) U.S. Cl.
CPC ........ *H10D 30/711* (2025.01); *H10W 74/117* (2026.01)

(58) Field of Classification Search
CPC ............. H01L 29/7841; H01L 23/3128; H01L 23/5228; H10B 41/40; H10B 43/40;

H10B 41/70; H10B 12/00; H10B 41/20; H10B 41/30; H10B 69/00; H10B 43/27; H10B 43/10; H10B 41/00; H10B 41/10; H10B 41/27; H10B 41/35; H10B 43/50;
(Continued)

(56) References Cited

U.S. PATENT DOCUMENTS 3,758,794 A * 9/1973 Kosonocky .......... G11C 19/282
257/E29.232
4,406,051 A * 9/1983 Lizuka .............. H01L 21/32155
438/238
(Continued)

FOREIGN PATENT DOCUMENTS

DE 4442067 A1 * 6/1995 ........... H01L 27/105
EP 0023655 A2 * 2/1981 ......... G11C 11/4085
(Continued)

*Primary Examiner* — Leonard Chang
*Assistant Examiner* — Tsz K Chiu
(74) *Attorney, Agent, or Firm* — Oblon, McClelland, Maier & Neustadt, L.L.P.

(57) ABSTRACT

The semiconductor wiring has the N-well layer of the impurity layer in the P substrate formed in the region where the poly wiring and P substrate face each other, wherein the N-well layer is electrically floating, is not used as a circuit element, and does not input or output signals. The semiconductor wiring is used as a transmission path of a high voltage signal, and used for a wiring that transmits a write signal of information at the memory cell array of the semiconductor memory device.

16 Claims, 6 Drawing Sheets

(51) Int. Cl.
H01L 29/788 (2006.01)
H10D 30/69 (2025.01)
H10W 74/10 (2026.01)

(58) Field of Classification Search
CPC ...... H10B 12/50; H10B 43/30; H10B 10/125;
H10B 43/35; H10B 12/20; H10B 41/50;
H10B 10/00; H10B 12/30; H10B 80/00;
H10B 12/31; H10B 43/00; H10B 41/41;
H10B 41/49; H10B 41/60; H10B 43/20;
H10B 12/05; H10B 12/053; H10B 12/10;
H10B 41/43; H10B 51/20; H10B 51/40;
H10B 53/10; H10B 53/20; H10B 53/40;
H10B 63/30; H10B 99/00; H10B 99/22;
H10B 10/12; H10B 12/01; H10B 53/30;
H10B 63/34; H10B 63/80; H10B 63/20;
H10B 63/84; H10B 61/00; H10B 61/10;
H10B 61/20; H10B 61/22; H10B 63/24
See application file for complete search history.

(56) References Cited

U.S. PATENT DOCUMENTS

| | | | | |
|---|---|---|---|---|
| 4,622,567 A * | 11/1986 | Pals | .................. | H01L 29/76816 |
| | | | | 348/320 |
| 4,812,419 A * | 3/1989 | Lee | ..................... | H01L 23/5226 |
| | | | | 438/650 |
| 4,841,352 A * | 6/1989 | Aso | ................... | H01L 27/11801 |
| | | | | 257/532 |
| 4,950,620 A * | 8/1990 | Harrington, III | ..... | G11C 11/417 |
| | | | | 257/904 |
| 5,280,454 A * | 1/1994 | Tanaka | ................... | G11C 16/16 |
| | | | | 365/185.11 |
| 5,401,997 A * | 3/1995 | Lien | ................... | H01L 27/0251 |
| | | | | 257/355 |
| 5,554,545 A * | 9/1996 | Wu | ..................... | H01L 21/8221 |
| | | | | 438/210 |
| 5,563,098 A * | 10/1996 | Kuo | .................. | H01L 21/76895 |
| | | | | 438/533 |
| 5,576,637 A * | 11/1996 | Akaogi | ............. | G11C 16/0416 |
| | | | | 326/54 |
| 5,747,846 A * | 5/1998 | Iida | ....................... | H01L 27/105 |
| | | | | 257/314 |
| 5,808,336 A * | 9/1998 | Miyawaki | ........... | H10D 86/201 |
| | | | | 257/315 |
| 5,942,779 A * | 8/1999 | Okita | ..................... | H10B 69/00 |
| | | | | 257/E21.422 |
| 6,165,822 A * | 12/2000 | Okuno | ............... | H01L 29/1608 |
| | | | | 257/E29.259 |
| 6,531,732 B2 * | 3/2003 | Sugita | .................... | H10B 69/00 |
| | | | | 257/E21.679 |
| 2001/0002800 A1 * | 6/2001 | Imamiya | ............... | G11C 16/08 |
| | | | | 327/309 |

| | | | | |
|---|---|---|---|---|
| 2002/0004921 A1 * | 1/2002 | Muranaka | ........... | G06F 11/1008 |
| | | | | 714/704 |
| 2002/0021611 A1 * | 2/2002 | Banba | ................... | H02M 3/073 |
| | | | | 365/189.11 |
| 2002/0057600 A1 * | 5/2002 | Sakui | .................... | G11C 16/16 |
| | | | | 365/185.27 |
| 2003/0146450 A1 * | 8/2003 | Natori | ................... | G11C 5/145 |
| | | | | 257/E27.103 |
| 2004/0094793 A1 * | 5/2004 | Noguchi | ............... | H10B 69/00 |
| | | | | 257/E21.679 |
| 2004/0124477 A1 * | 7/2004 | Minami | ................ | H10B 43/30 |
| | | | | 438/210 |
| 2005/0068832 A1 * | 3/2005 | Andoh | ..................... | G11C 7/04 |
| | | | | 365/222 |
| 2006/0246716 A1 * | 11/2006 | Colombo | ........ | H01L 21/823857 |
| | | | | 257/E21.639 |
| 2008/0151590 A1 * | 6/2008 | Rogers | ............... | H01L 27/0248 |
| | | | | 257/E23.001 |
| 2009/0114919 A1 | 5/2009 | Kawahito et al. | | |
| 2010/0252716 A1 * | 10/2010 | Kalevo | ................. | H04N 25/00 |
| | | | | 250/336.1 |
| 2011/0235457 A1 * | 9/2011 | Hirata | ................... | G11C 5/147 |
| | | | | 365/226 |
| 2012/0051120 A1 * | 3/2012 | Kamata | ................. | H10D 87/00 |
| | | | | 365/149 |
| 2012/0069682 A1 * | 3/2012 | Joo | ........................ | G11C 16/08 |
| | | | | 365/185.25 |
| 2012/0081965 A1 * | 4/2012 | Matsukawa | ...... | G11C 29/50004 |
| | | | | 365/185.28 |
| 2012/0118979 A1 * | 5/2012 | Kurokawa | ....... | G06K 19/07767 |
| | | | | 235/492 |
| 2012/0313692 A1 * | 12/2012 | Sutardja | ................. | H01L 28/20 |
| | | | | 327/535 |
| 2014/0231952 A1 * | 8/2014 | Hahn | ............... | H01L 29/66272 |
| | | | | 257/488 |
| 2014/0367552 A1 * | 12/2014 | Hynecek | .............. | H04N 25/771 |
| | | | | 257/230 |
| 2016/0181351 A1 * | 6/2016 | Kim | .................... | H01L 27/0629 |
| | | | | 438/382 |
| 2017/0207296 A1 * | 7/2017 | Karino | .................... | H01L 28/20 |
| 2020/0091280 A1 * | 3/2020 | Sueyama | ............. | H10D 64/251 |
| 2020/0243518 A1 * | 7/2020 | Patti | .................... | H01L 21/8258 |
| 2020/0388671 A1 | 12/2020 | Takemoto | | |
| 2023/0186969 A1 * | 6/2023 | Cho | ....................... | G11C 11/408 |
| | | | | 711/106 |

FOREIGN PATENT DOCUMENTS

| | | | |
|---|---|---|---|
| JP | 04-133468 A | 5/1992 | |
| JP | 04-313237 A | 11/1992 | |
| JP | 5-121664 A | 5/1993 | |
| JP | 2000-252426 A | 9/2000 | |
| JP | 2012-9481 A | 1/2012 | |
| KR | 20070095782 A * | 10/2007 | .......... H01L 27/105 |

* cited by examiner

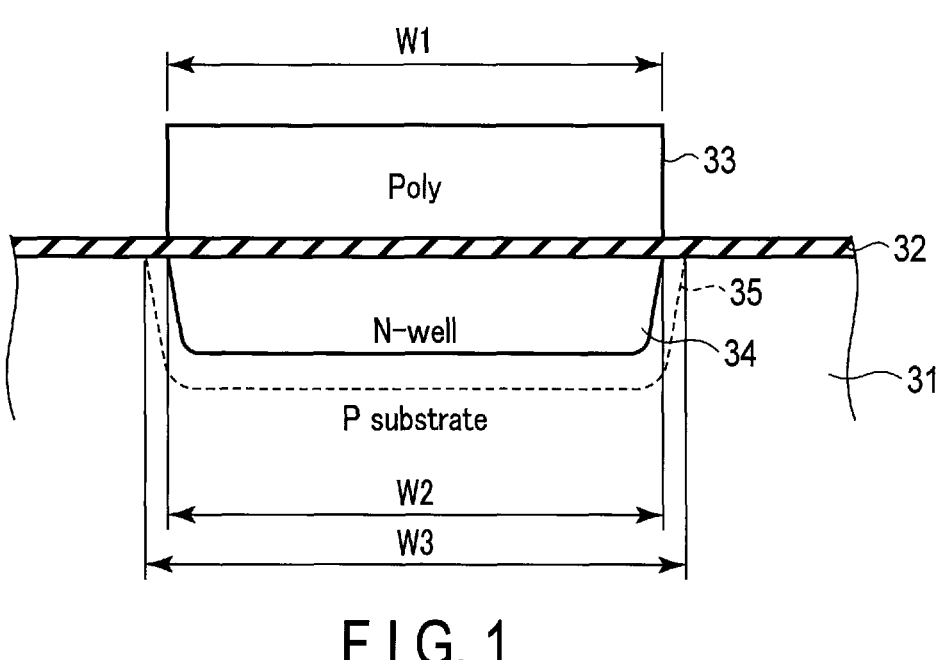
W1
33
Poly
32
35
N-well
34
31
P substrate
W2
W3
F I G. 1
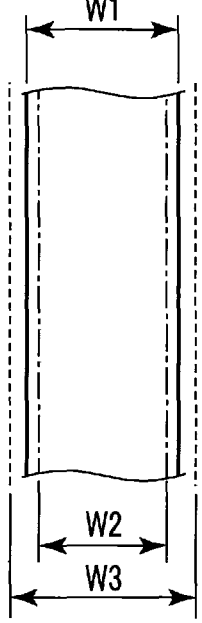
W1
W2
W3
F I G. 2

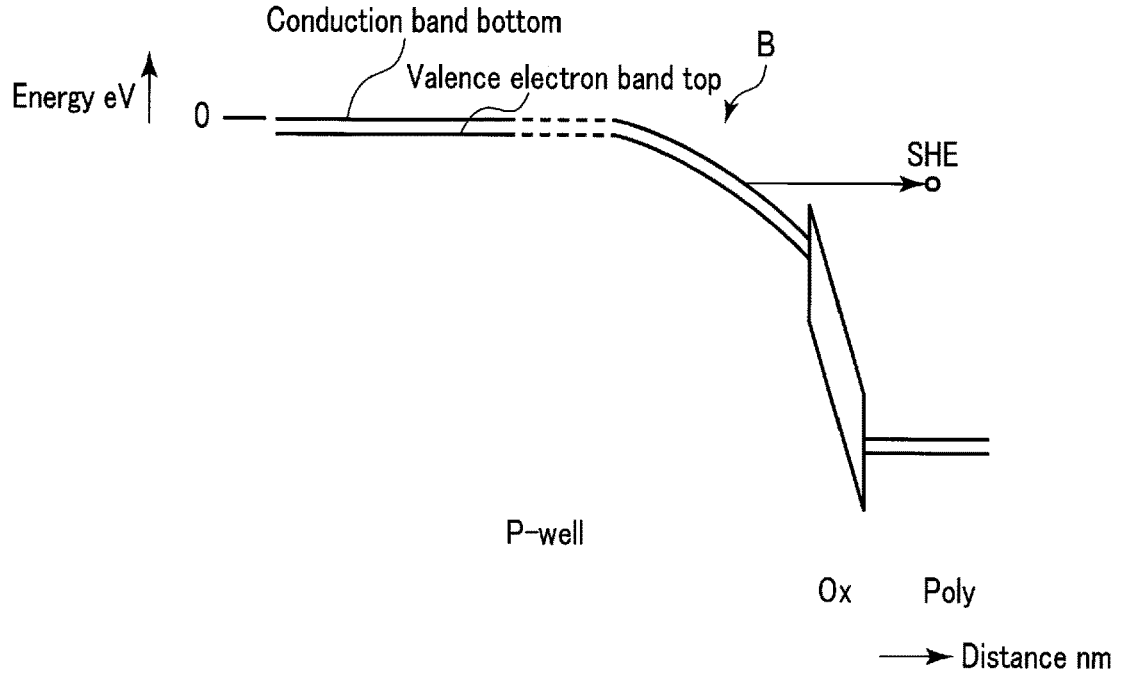
F I G. 3A
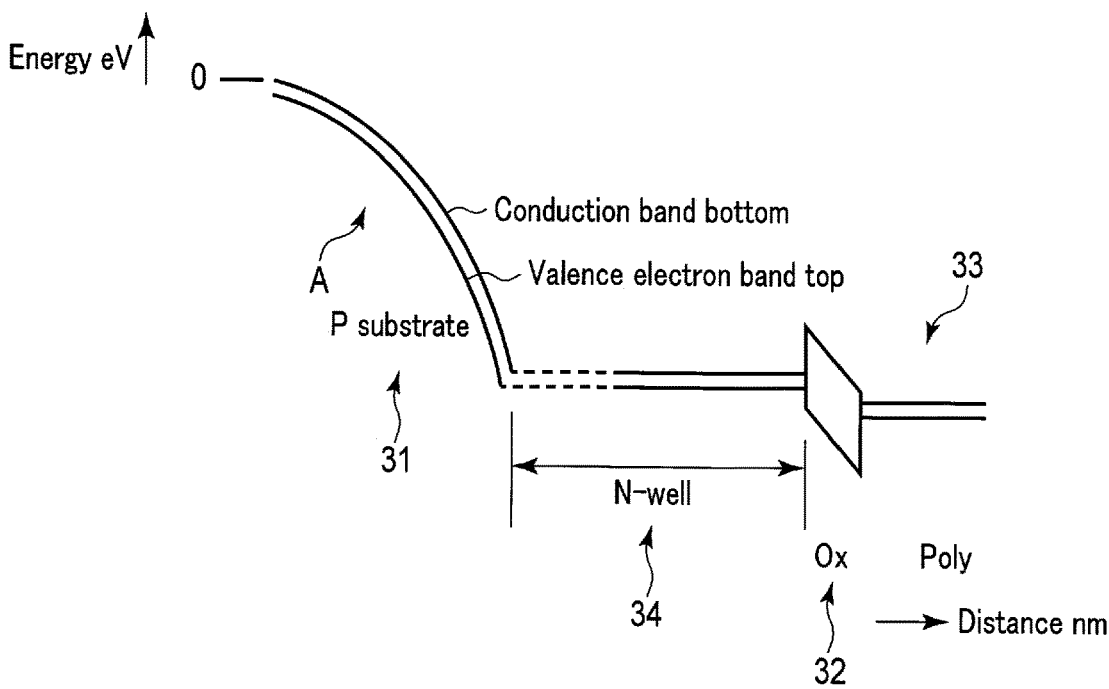
F I G. 3B

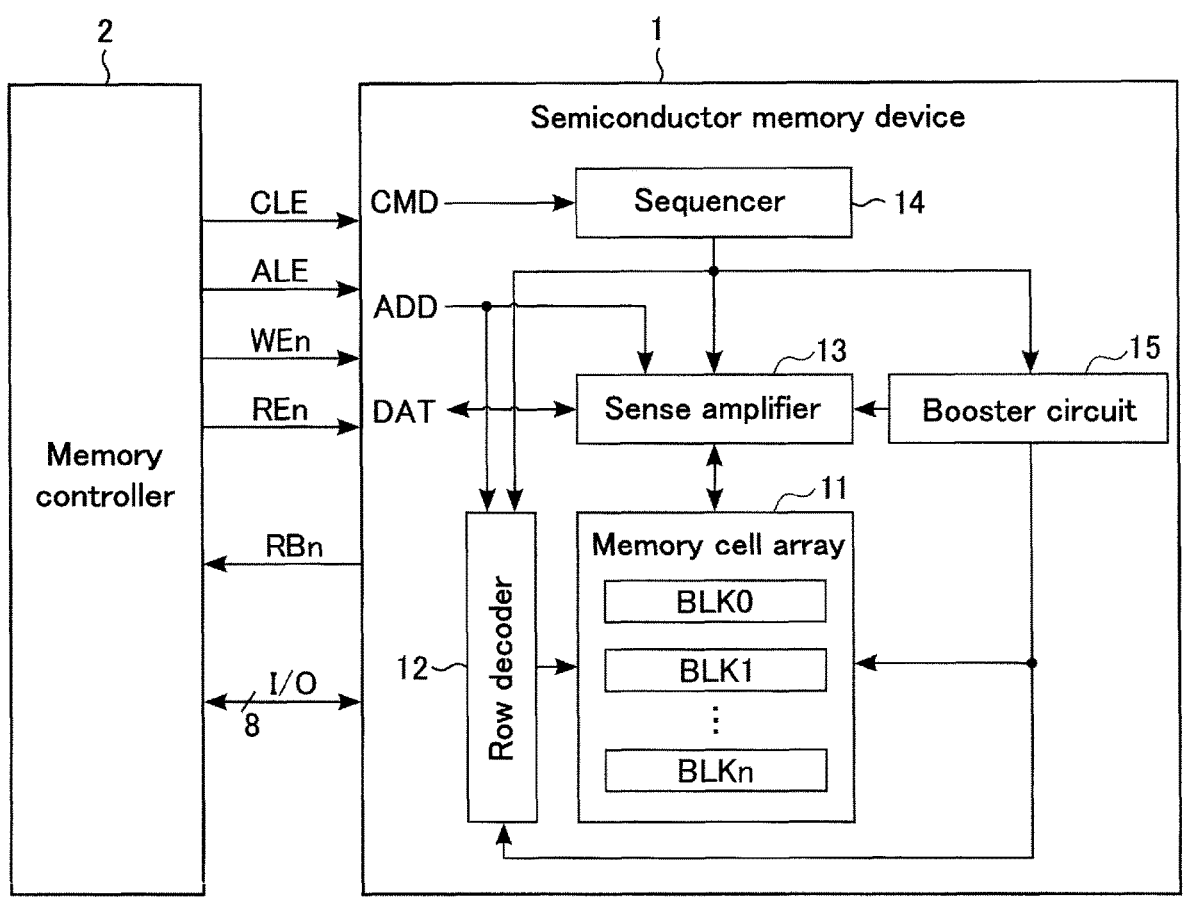
F I G. 4

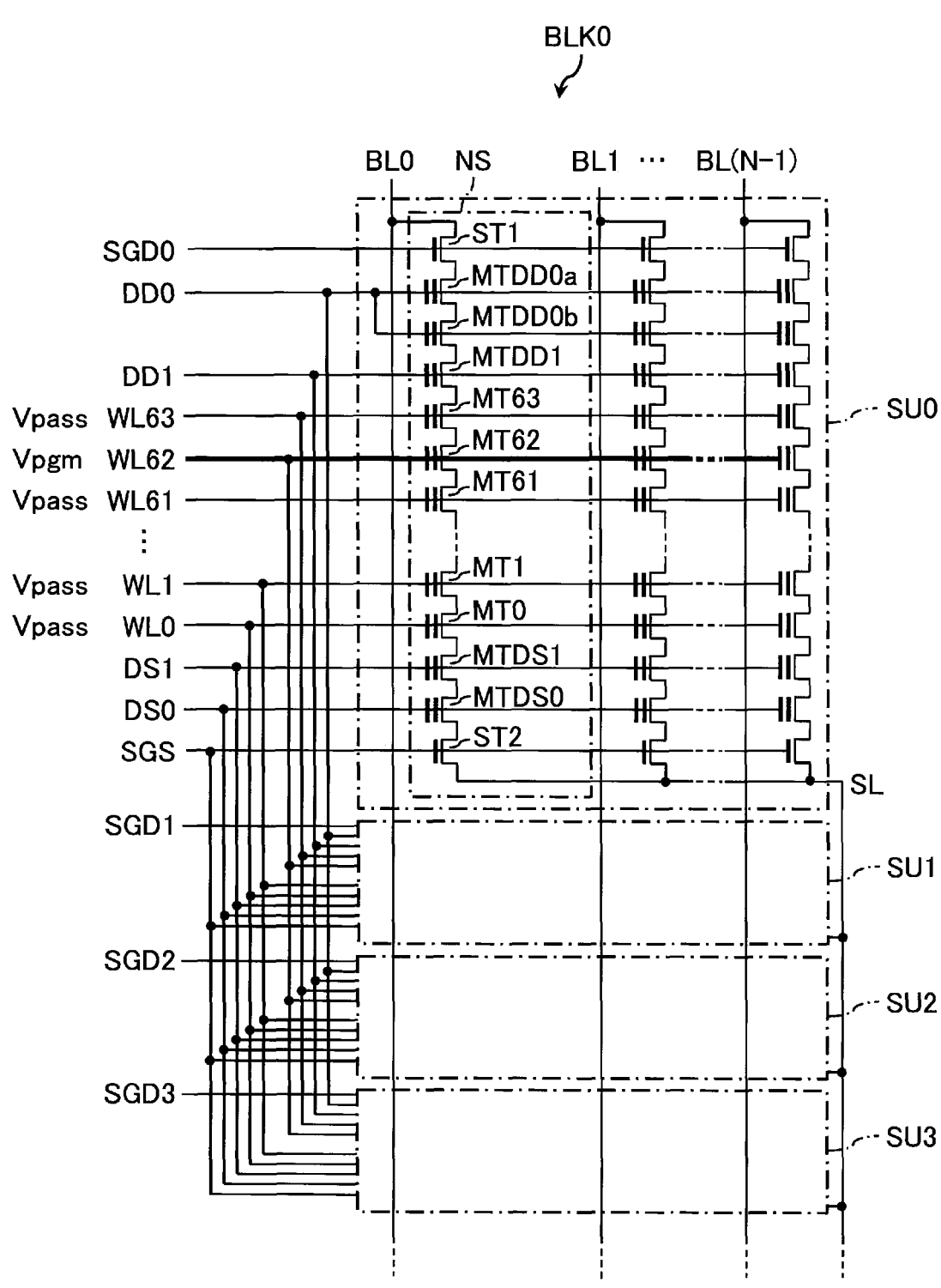
F I G. 5

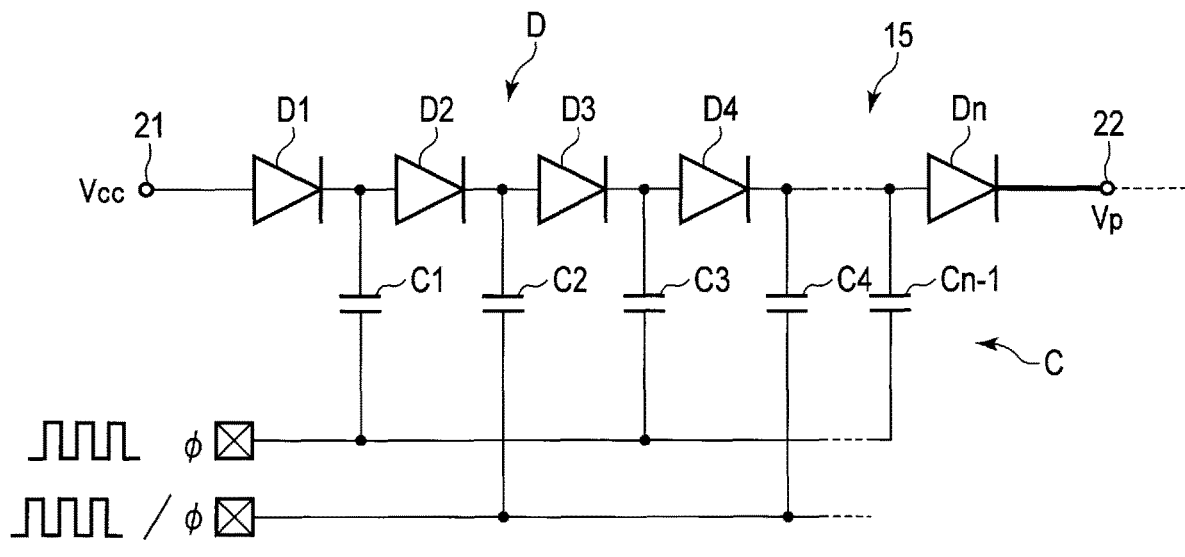
F I G. 6
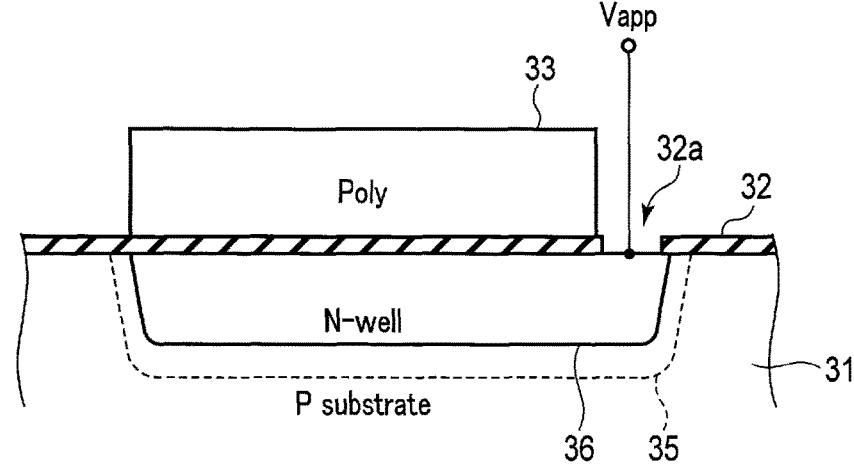
F I G. 7

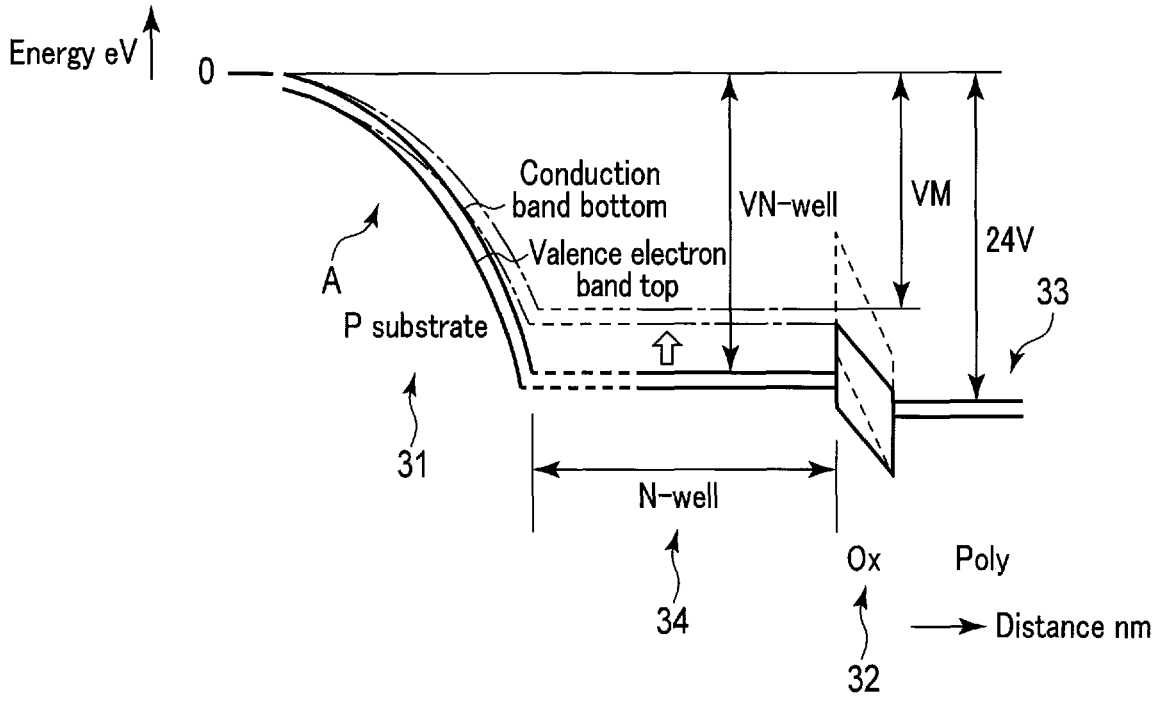
F I G. 8
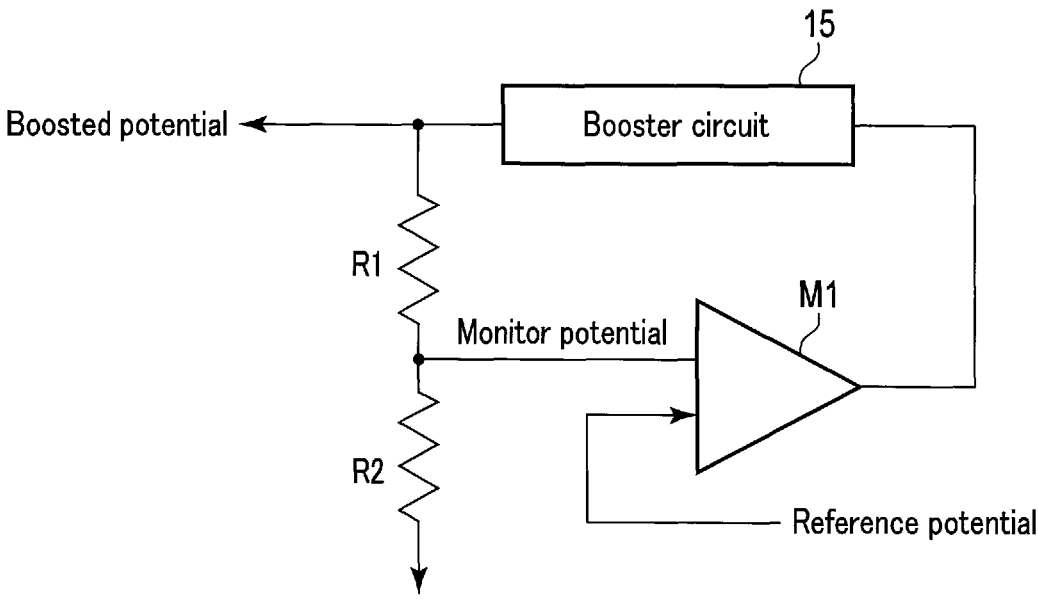
F I G. 9

BOOSTER CIRCUIT FOR SEMICONDUCTOR MEMORY DEVICE

CROSS-REFERENCE TO RELATED APPLICATIONS

This application is a divisional of and claims benefit under 35 U.S.C. § 120 to U.S. application Ser. No. 16/568,737, filed Sep. 12, 2019, which is based upon and claims the benefit of priority under 35 U.S.C. § 119 from Japanese Patent Application No. 2018-237033, filed Dec. 19, 2018, the entire contents of each of which are incorporated herein by reference.

FIELD

The embodiment described herein relate to a semiconductor device.

BACKGROUND

In the semiconductor device, a semiconductor wiring that connects between circuit elements is provided.

The embodiment provides a semiconductor device including a semiconductor wiring that suppresses an increase in resistance value occurring when a high voltage signal is transmitted.

BRIEF DESCRIPTION OF THE DRAWINGS

FIG. 1 is a diagram showing a cross-sectional structure of a semiconductor wiring provided in a semiconductor device according to an embodiment;

FIG. 2 is a diagram showing an arrangement relationship between a poly wiring and a floating N-well layer;

FIG. 3A is a diagram conceptually showing an energy band related to the poly wiring with a high voltage applied thereto and substrate hot electrons;

FIG. 3B is a diagram conceptually showing an energy band related to the poly wiring with a high voltage applied thereto and the floating N-well layer;

FIG. 4 is a block diagram showing an example of an entire configuration of a semiconductor memory device according to the embodiment;

FIG. 5 is a block diagram showing an example of a circuit configuration of a memory cell array of the semiconductor memory device;

FIG. 6 is a diagram of a configuration example of a booster circuit;

FIG. 7 is a cross-sectional diagram showing a modified example of the semiconductor wiring that applies an application voltage to the floating N-well layer;

FIG. 8 is a diagram also describing an energy band when an intermediate voltage VM is applied in addition to the energy band related to the poly wiring with the high voltage applied thereto and the floating N-well layer; and FIG. 9 is a diagram showing an example of an output control circuit that performs feedback control.

DETAILED DESCRIPTION

Hereinafter, an embodiment will be described with reference to the drawings.

The drawings are schematic or conceptual, and dimensions, proportions, and the like of the drawings are not necessarily the same as actual ones. In addition, the technical ideas of the embodiment are not limited by shapes, structures, arrangements, or the like of components. In the following description, components having substantially the same functions and configurations will be assigned the same reference signs and detailed explanations will be omitted.

The embodiment is applied to a region where there is disposed a semiconductor wiring whose resistance is reduced by impurity introduction processing or the like, for example, a poly wiring formed of a semiconductor material including polycrystalline silicon, that is, poly silicon. The poly wiring is, for example, a poly wiring that electrically connects between circuit elements or a poly wiring used as a resistor element of circuit elements. Here, the poly wiring that electrically connects between circuit elements will be described as an example. The poly wiring allows the value of wiring resistance to be adjusted by introducing impurities. The embodiment is to suppress generation of hot electrons that affect the wiring or the like when the poly wiring transmits a high voltage signal, for example, a write signal Vpgm boosted to 20 V or more. In the embodiment, the hot electrons generated here are referred to as substrate hot electrons (SHE) because they are released from a P-type semiconductor substrate.

The substrate hot electrons (SHE) occur, for example, when a high voltage signal is applied to the poly wiring formed on the P-type semiconductor substrate (or P-type well layer) and a surface of the semiconductor substrate becomes a deep depletion state (deeply depleted state). A phenomenon occurs in which the substrate hot electrons generated there jump into the poly wiring and raise wiring resistance. It is presumed that the rise in wiring resistance is affected by release of hydrogen in the poly silicon partly caused by the hot electrons. The rise in wiring resistance due to the generation of the substrate hot electrons may lower the voltage value of the signal being transmitted below a set voltage value, causing a possibility of occurrence of malfunction. As a countermeasure against the voltage drop, if a voltage at the time of output is increased, an amount of power consumption increases due to the increase in resistance value, contributing to heat generation, increasing the SHE to accelerate the speed of increase in resistance value, and contributing to shortening lifetime of the semiconductor device.

A semiconductor wiring provided in the semiconductor device of the embodiment will be described with reference to FIGS. 1, 2, 3A and 3B. FIG. 1 shows a cross-sectional structure of a wiring formed on a semiconductor substrate, and FIG. 2 shows a relationship between the wiring and a floating layer.

In an example shown in FIG. 1, a poly wiring layer 33 composed of a poly silicon wiring layer is formed on a P-type semiconductor substrate (hereinafter referred to as a P substrate) 31, via, for example, an insulating layer 32 composed of a silicon oxide film. In the embodiment, an electrically floating impurity layer which is not used as a circuit element and which signals are not input into or output from is formed in the P substrate 31 in contact with the insulating layer 32 in a region where the poly wiring layer 33 and P substrate 31 face each other. As this impurity layer, for example, an N-type layer which is an N-type semiconductor layer or an N-well layer 34 is formed. That is, in FIG. 1, a semiconductor wiring (or semiconductor resistor layer described later) having an integrated laminate structure of the N-well layer 34-insulating layer 32-poly wiring layer 33 is formed on the P substrate (P-well layer). Note that the semiconductor wiring is not limited to a structure in which the semiconductor wiring is horizontally extended and each layer is stacked in a depth direction (or height direction) and may have a structure in which the semiconductor wiring is extended in a direction intersecting with the horizontal direction and each layer is disposed in a side direction (or horizontal direction). Here, although the N-well layer is described as an example, the same function and effect can be obtained even with an N-type layer.

In the following description, the N-well layer 34 is referred to as floating N-well layer 34 because it is not connected with other circuit elements and electrically floating. The P-type semiconductor and N-type semiconductor are referred to as semiconductor of a first conductivity type and semiconductor of a second conductivity type. The P-type semiconductor and N-type semiconductor may be any conductivity types opposite to each other. That is, if the P-type semiconductor is the first conductivity type, the N-type semiconductor is the second conductivity type. Conversely, if the P-type semiconductor is the second conductivity type, the N-type semiconductor is the first conductivity type. Although the embodiment shows an example in which the floating N-well layer, i.e. the N-type floating layer is formed in the P substrate, on the contrary, a floating P-well layer, i.e. a P-type floating layer may be formed in the N substrate. Note that the N-type floating layer or P-type floating layer is referred to as floating layer.

In the floating N-well layer 34, impurities such as a pentavalent element, for example, phosphorus (P) or arsenic (As) are introduced, for example, by an ion injection process.

Of course, an impurity introduction method is not limited to the ion injection method, and other known processes may be used. Impurity concentration of the floating N-well layer 34 is appropriately set at the time of circuit element design, and, for example, it may be the same concentration as circuit elements such as a source and a drain included in an ordinary transistor. The floating N-well layer 34 can be simultaneously formed in the same process in a step of forming N-well layers of other circuit elements of a transistor or the like.

The floating N-well layer 34 is boosted to a high voltage by capacitive coupling with the poly wiring layer 33 via the insulating layer 32, and as shown in FIG. 3B described later, thereby substantially eliminating bending of a band in the vicinity of the insulating layer 32 of the semiconductor substrate immediately below the poly wiring layer 33, suppressing generation of substrate hot electrons and substantially eliminating the band bending, and making it difficult for electrons cross a potential barrier. Here, a high voltage signal transmitted to the poly wiring layer 33 is presumed to be a pulse signal such as a clock signal, and one example is a write signal Vpgm transmitted to a word line WL.

A width W2 of the floating N-well layer 34 is desired to be equal to or substantially equal to a width W1 of the poly wiring layer 33. However, when the width is wide, the effect is reduced but not lost. In addition, narrowing the width can increase the effect. As shown in FIG. 2, even if the width W2 of the floating N-well layer 34 is less than the width W1 of the poly wiring layer 33, as long as a width W3 obtained by adding a width of a depletion layer 35 generated around the floating N-well layer 34 to the width W2 of the floating N-well layer 34 is equal to or more than the width W1 of the poly wiring layer 33, the same function and effect can be obtained. In the embodiment, the configuration example in which one floating N-well layer 34 is formed as a pair below one poly wiring layer 33 is described, but when a large number of poly wiring layers 33 are densely formed, one floating N-well layer 34 of a width encompassing the large number of poly wiring layers 33 may be formed. Because, when a high voltage signal is applied to the poly wiring layer 33, by reducing capacitance with the P substrate 31, the floating N-well layer 34 can be expected to raise potential, a thin layer thickness is desirable within a range in which there is an effect to suppress release of substrate hot electrons (SHE).

A layer thickness of the insulating layer 32 is appropriately set according to a withstand voltage with respect to the magnitude of a signal (voltage value and current value) transmitted to the poly wiring layer 33 and the impurity concentration and capacitance value of the floating N-well layer 34. For insulating layer 32, if an electric field is 5-6 MV/cm or more, a tunnel current flowing in the insulating layer 32 becomes a problem. Consequently, the insulating layer 32 needs a thickness that prevents the electric field from exceeding 5-6 MV/cm. In an example of a high voltage of 24 V, 6 MV corresponds to 40 nm. Therefore, the layer thickness of the insulating layer 32 needs to be a thickness of 40 nm or more.

In the embodiment, the floating N-well layer 34 is formed in the P substrate, but it is not limited to the substrate. If a formation target of the wiring is a structure of stacking circuit elements, for example, a structure of stacking memory cell arrays 11, the floating N layer or floating N-well layer 34 may be formed in a P-type semiconductor layer (or P-type semiconductor region) disposed at a position facing a wiring to be formed in the stacking layer.

In the embodiment, the example in which the floating N-well layer 34 is formed on only one surface (surface facing the P substrate) side of the poly wiring layer 33 is described, but it is not limited to this. For example, it is assumed that the formation position of the floating N-well layer 34 shown in FIG. 1 is below the poly wiring layer 33 having a rectangular cross-sectional shape. If the poly wiring layer 33 is covered with the P-type semiconductor layer via the insulating layer, the floating N-well layer 34 may be formed in a P-type semiconductor layer in contact on the side of the rectangle, or the floating N-well layer 34 may be formed in a P-type semiconductor layer in contact on the upper side of the rectangle. The floating N-well layer 34 is not limited to being disposed facing one surface side of the poly wiring layer 33 and may be provided so as to face one or more surfaces such as the upper and lower surfaces. The poly wiring layer 33 is not limited to the rectangular cross-sectional shape, and may be formed, for example, in a circular shape or an elliptical shape. In that case, the floating N-well layer 34 may be formed so as to surround a half circumference or about a ⅓ circumference via the insulating layer.

With reference to energy bands shown in FIGS. 3A and 3B, characteristics of generation of substrate hot electrons and the poly wiring layer 33 provided on the P substrate 31 including the floating N-well layer 34 of the embodiment will be described. FIG. 3A is a diagram conceptually showing an energy band related to the wiring with a high voltage applied thereto and substrate hot electrons, and FIG. 3B is a diagram conceptually showing an energy band related to the wiring with a high voltage applied thereto and the floating N-well layer.

An energy band B shown in FIG. 3A shows characteristics of the wiring when a high voltage is applied to the poly wiring layer for which the floating N-well layer 34 is not provided. In the energy band B, the upper limit shows the characteristics of the energy of a conduction band bottom, and the lower limit shows a valence electron band top. The energy band B has band bending in which the level of an energy eV sharply decreases in the vicinity of an interface of the P substrate in contact with the insulating layer. As shown in the energy band B, when the band bending is sharp, electrons (SHE) cross the potential barrier formed by the insulating layer 32 from within the P substrate 31 and jump into the poly wiring layer. As is well known, the hot electrons (SHE) affect characteristics of the intruded poly layer to increase its resistance value. That is, the resistance value of the poly wiring layer increases.

An energy band A shown in FIG. 3B when a high voltage is applied to the poly wiring layer 33 of the embodiment has band bending in which an energy eV decreases from the P substrate 31 to the interface of the floating N-well layer 34 by the floating N-well layer 34. For the band bending of the energy eV, the inclination of the bending changes due to the impurity concentration of the floating N-well layer 34. The band bending of the energy eV flattens, as shown in FIG. 3B, as the impurity concentration of the floating N-well layer 34 becomes higher. Furthermore, in the floating N-well layer 34, the energy eV substantially does not increase or decrease, transits in parallel below the potential barrier (upper limit) of the interface of the insulating layer 32, and is in contact with the potential barrier of the interface of the insulating layer 32. Therefore, even if a high voltage signal is applied to the poly wiring layer, because the band bending of the energy eV is flattened, it is possible to suppress the release of substrate hot electrons (SHE) to the poly wiring layer 33 from the P substrate 31 via the N-well layer 34 due to the band bending.

From the above, the wiring of the embodiment suppresses the generation of substrate hot electrons, thereby can prevent an increase in wiring resistance of the poly wiring, prevent a reduction in voltage of a high voltage signal being transmitted, and transmit the signal of a voltage value preset to circuit elements. Furthermore, it can prevent an increase in power consumption amount and heat generation due to voltage rise to cope with high resistance of the wiring and also prevent acceleration of speed increasing the resistance value caused by an increase in SHE due to the voltage rise.

First Application Example

As one example of the semiconductor device in which the semiconductor wiring according to the embodiment is provided, a semiconductor memory device will be described below.

First, an entire configuration of a semiconductor memory device 1 will be described.

FIG. 4 shows an example of the entire configuration of the semiconductor memory device 1. The semiconductor memory device 1 is controlled by, for example, an external memory controller 2, and is a NAND flash memory capable of storing data in a nonvolatile manner. The semiconductor memory device 1 includes, for example, a memory cell array 11 and peripheral circuits. The peripheral circuits include, for example, a row decoder 12, a sense amplifier 13, a sequencer 14, and a booster circuit 15.

First, the memory cell array 11 includes a plurality of blocks BLK0-BLKn described later, where "n" is an integer of one or more. A block BLK is a group of nonvolatile memory cells and is used as, for example, an erase unit of data. In the memory cell array 11, a plurality of bit lines and a plurality of word lines are provided in a matrix. One memory cell is associated with one bit line and one word line.

The row decoder 12 selects one block BLK on the basis of address information ADD received from the memory controller 2 by the semiconductor memory device 1. The row decoder 12 then applies a preset voltage, for example, an intermediate pass voltage Vpass (write inhibition signal) or a high voltage write voltage Vpgm (write signal) to, for example, each of selected word lines WL and unselected word lines WL.

In the write operation, the sense amplifier 13 holds write data DAT received from the memory controller 2 by the semiconductor memory device 1, and applies a write signal of a set voltage to the bit line on the basis of the write data DAT. In the read operation, the sense amplifier 13 determines data stored in the memory cell on the basis of a voltage of the bit line and outputs read data DAT based on the determination result to the memory controller 2.

The sequencer 14 controls overall operation of the semiconductor memory device 1 on the basis of a command CMD received from the memory controller 2 by the semiconductor memory device 1. Communication between the semiconductor memory device 1 and memory controller 2 supports, for example, a NAND interface standard. For example, communication between the semiconductor memory device 1 and memory controller 2 uses a command latch enable signal CLE, an address latch enable signal ALE, a write enable signal WEn, a read enable signal REn, a ready busy signal RBn, and an input/output signal I/O. The input/output signal I/O is, for example, a signal of eight bits and includes a command CMD, address information ADD, data DAT, and the like.

The command latch enable signal CLE is a signal indicating that an input/output signal I/O received by the semiconductor memory device 1 is a command CMD. The address latch enable signal ALE is a signal indicating a signal I/O received by the semiconductor memory device 1 is address information ADD. The write enable signal WEn is a signal instructing the semiconductor memory device 1 to input an input/output signal I/O. The read enable signal REn is a signal instructing the semiconductor memory device 1 to output an input/output signal I/O. The ready busy signal RBn is a signal notifying the memory controller 2 whether the semiconductor memory device 1 is in a ready state of receiving an instruction from the memory controller 2 or in a busy state of not receiving the instruction.

The booster circuit 15 is a circuit that boosts a clock signal (pulse signal) Φ or /Φ (inverted signal of Φ) or the like output from an oscillation circuit disposed in a previous stage to a voltage value set to each component and supplies a boosted voltage signal. Here, according to a command from the sequencer 14, the boosted voltage signal is supplied to the memory cell array 11, row decoder 12, and sense amplifier 13. As will be described later, the wiring of the embodiment is used in part of the output side of the booster circuit 15.

The semiconductor memory device 1 and memory controller 2 described above may form one semiconductor memory device by a combination of them. Examples of such a semiconductor memory device include a memory card like an SD™ card (registered trademark), and an SSD (Solid State Drive).

Next, the memory cell array 11 of the semiconductor memory device 1 will be described.

FIG. 5 shows a circuit configuration of one block BLK of the plurality of blocks BLK included in the memory cell array 11 as an example of the circuit configuration of the memory cell array 11 shown in FIG. 4.

As shown in FIG. 5, the block BLK 0 includes, for example, four string units SU (SU0-SU3). Each of the string units SU includes a plurality of NAND strings NS. Each of the NAND strings NS includes, for example, 64 memory cell transistors MT0-MT63, 5 dummy memory cell transistors MTDD0a, MTDD0b, MTDD1, MTDS0 and MTDS1, and select transistors ST1 and ST2.

Hereinafter, when the memory cell transistors MT0-MT63 are not limited, they are represented as memory cell transistor MT. When the dummy memory cell transistors MTDD0a, MTDD0b, MTDD1, MTDS0, and MTDS1 are not limited, they are represented as dummy memory cell transistor MTD.

The memory cell transistor MT and dummy memory cell transistor MTD each include a control gate and a charge storage layer. The memory cell transistor MT holds data in a non-volatile manner. The dummy memory cell transistor MTD has the same configuration as the memory cell transistor MT but is used as a dummy and is not used to hold data.

The memory cell transistor MT and dummy memory cell transistor MTD may be a MONOS type using an insulating layer for the charge storage layer, or may be an FG type using a conductive layer for the charge storage layer. In the embodiment, the MONOS type is described below as an example.

The number of memory cell transistors MT may be 8, 16, 32, 96, 128, or the like, and the number is not limited. In addition, the numbers of the dummy memory cell transistors MTD and select transistors ST1 and ST2 are arbitrary. Regarding the select transistors ST1 and ST2, one or more each should be provided.

The memory cell transistors MT and dummy memory cell transistors MTD are connected in series between a source of the select transistor ST1 and a drain of the select transistor ST2. More specifically, the dummy memory cell transistors MTDS0 and MTDS1, the memory cell transistors MT0-MT63, and the dummy memory cell transistors MTDD1, MTDD0b, and MTDD0a have their current paths connected in series. A drain of the dummy memory cell transistor MTDD0a is connected to the source of the select transistor ST1, and a source of the dummy memory cell transistor MTDS0 is connected to the drain of the select transistor ST2.

Gates of the select transistors ST1 of the string units SU0-SU3 are connected to select gate lines SGD0-SGD3, respectively. Gates of the select transistors ST2 of the string units SU0-SU3 are commonly connected to a select gate line SGS. Hereinafter, when the select gate lines SGD0-SGD3 are not limited, they are represented as select gate line GSD. Note that the gates of the select transistors ST2 of the string units SU0-SU3 may be connected to different select gate lines SGS0-SGS3, respectively.

Control gates of the memory cell transistors MT0-MT63 in the blocks BLK are commonly connected to word lines WL0-WL63, respectively. Control gates of the dummy memory cell transistors MTDD0a and MTDD0b disposed in the blocks BLK are commonly connected to a dummy word line DD0. Control gates of the dummy memory cell transistors MTDD1, MTDS0, and MTDS1 disposed in the blocks BLK are commonly connected to dummy word lines DD1, DS0, and DS1, respectively.

In the following description, when any of the word lines WL0-WL63 is not limited, it is generically referred to as word line WL. When any of the dummy word lines DD0 and DD1 is not limited, it is generically referred to as dummy word line DD, and when any of the dummy word lines DS0 and DS1 is not limited, it is referred to as dummy word line DS in the same manner. Furthermore, when any of the dummy memory cell transistors MTDD0a and MTDD0b is not limited, it is generically referred to as dummy memory cell transistor MTDD0.

Drains of the select transistors ST1 of each NAND string NS in the string unit SU are connected to different bit lines BL0-BL (N−1, where "N" is an integer of two or more), respectively. Hereinafter, any of the bit lines BL0-BL (N−1) is not limited, it is represented as bit line BL. Each bit line BL commonly connects one NAND string NS in each string unit SU among the plurality of blocks BLK. Furthermore, sources of the plurality of select transistors ST2 are commonly connected to a source line SL. That is, the string unit SU is an aggregation of NAND strings NS connected to different bit lines BL and connected to the same select gate line SGD. The block BLK is an aggregation of a plurality of string units SU sharing the word line WL. The memory cell array 10 is a group of a plurality of blocks BLK sharing the bit line BL.

Data write and read operations are collectively performed on memory cell transistors MT connected to any word line WL in any string unit SU.

Next, the booster circuit 15 in which the semiconductor wiring of the embodiment is provided will be described.

FIG. 6 is a diagram indicating an example of configuration example of the booster circuit 15. The booster circuit 15 is equivalent to a charge pump circuit. The booster circuit 15 boosts an input pulse signal or the like to a positive voltage larger than a supplied external voltage Vcc to generate a high voltage signal VP. Here, the booster circuit 15 that generates a positive voltage will be described as an example, but a negative voltage smaller than the external voltage Vcc can be also generated by arranging an anode and a cathode in the opposite direction with respect to a diode D shown in FIG. 6. Although the diode D is shown as a circuit element in the embodiment, it is also possible to substitute a MOS transistor. When the MOS transistor is used, it can be implemented by connecting its gate to the drain, causing the drain to function as a cathode, and causing the source to function as an anode. Therefore, a diode can be manufactured by changing connection of a circuit element formed as a transistor without adding a manufacturing step for creating the diode.

Diodes D1-Dn of the booster circuit 15 are connected in series so as to connect the cathode of a previous stage diode, for example, the diode D1 to the anode of the subsequent stage diode D2. The anode of the first stage diode D1 is connected to a supply terminal 21 and supplied with the external voltage Vcc. The cathode serving as an output end of the last stage diode Dn is connected to an output terminal 22. Furthermore, the clock signal Φ is input into the cathodes of the odd-numbered stage diodes D1, D3, . . . via capacitor elements C1, C3, . . . . The inverted clock signal /Φ is input into the cathodes of the even-numbered stage diodes D2, D4, . . . via the capacitor elements C2, C4, . . . .

In such a circuit configuration, by alternately booting a voltage across both ends of each capacitor element C1 to Cn−1 by the clock signal (Φ and /Φ), the positive voltage signal Vp boosted to a higher voltage than the external voltage Vcc is output from the cathode of the last stage diode Dn.

In the booster circuit 15, the poly wiring layer 33 including the floating N-well layer 34, i.e. the wiring of the embodiment is applied to a wiring shown by a thick line connecting the cathode of the last stage diode Dn and the output terminal 22.

In the semiconductor memory device 1, the booster circuit 15 outputs signals VP boosted to any given voltage values set for each supply destination to the memory cell array 11, row decoder 12, and sense amplifier 13. For example, on receiving the signal VP, the row decoder 12 outputs the write signal Vpgm of 20 V or more to the word line WL. As an example of driving, it selects the word line WL62, applies the write signal Vpgm of a high voltage of 24 V or so, and applies the pass voltage signal Vpass of an intermediate voltage of, for example, 10 V to each of the unselected word lines WL0, WL1, . . . , WL 61, WL63. Consequently, the semiconductor wiring layer 33 including the floating N-well layer 34 of the embodiment is applied to the word lines WL0-WL63.

In a wiring connecting the booster circuit 15 (for example, a first circuit) and a circuit element, for example, the row decoder 12 (for example, a second circuit), when there is a wiring having long wiring distance including interlayer connection that connects an upper layer and a lower layer, for example, a metal wiring is also used. The poly wiring layer 33 in the embodiment may be used as a partial or short line when used to connect among a plurality of circuits or when used as a wiring around circuit elements viewed from the whole wiring.

As described above, the semiconductor wiring of the embodiment can be applied to a memory cell array developed two-dimensionally and word lines WL in each layer of memory cells of a hierarchical structure in which such memory cells are hierarchically stacked. Using the semiconductor wiring for the word line WL can suppress substrate hot electrons (SHE) due to a high voltage signal such as the write signal Vpgm, prevent a rise in voltage value and an increase in power consumption, and eliminate one cause of heat generation.

Modified Example

A modified example of the poly wiring layer 33 including the floating N-well layer 34, i.e. the semiconductor wiring according to the embodiment will be described with reference to FIG. 7. FIG. 7 shows a cross-sectional configuration of the poly wiring layer 33 including an island N-well layer 36 which is a modified example.

This modified example shows the N-well layer 36 in which part of the insulating layer 32 on the P substrate 31 shown in FIG. 1 is removed, an exposed window 32*a* is opened to the floating N-well layer 34 (or N-type layer), and an external terminal Vapp is connected. The N-well layer 36 is not used as a circuit element either, signals (such as an information signal and a control signal) are not input or output, and so it is in an island state. Therefore, the N-well layer 36 is normally an impurity layer of a floating potential. The N-well layer 36 becomes electrically charged up state when an arbitrary voltage VM is applied from the external terminal Vapp. In the following description, the floating N-well layer 34 with a voltage applied thereto is referred to as island N-well layer 36 (island impurity layer). The island N-well layer 36 is good as long as it is in a charged up state when a high voltage is applied to the poly wiring layer 33. Therefore, application of the arbitrary voltage to the island N-well layer 36 needs to be applied at least when a high voltage is applied to the poly wiring layer 33, and it is not essential to constantly apply the arbitrary voltage to the island N-well layer 36.

FIG. 8 is a diagram also describing an energy band when an intermediate voltage VM, for example, 18 V or so is applied to the island N-well layer 36 from the outside through the external terminal Vapp in addition to the energy band shown in FIG. 3B described before.

As shown in FIG. 8, in the island N-well layer 36 with the intermediate voltage VM applied thereto, the energy level rises and an energy level of a forbidden band due to the insulating layer 32 also rises. Assuming that a high voltage of, for example, 24 V or so is applied to the poly wiring layer 33, a voltage applied to the insulating layer 32 is 24 V−18 V=6 V. As described before, in the example of the high voltage of 24 V, the thickness of the insulating layer 32 is preferably 40 nm or more.

The electric field at this time is 6 V/40 nm=1.5 MV/cm, almost no current (FN tunnel current) flows in the insulating layer 32, and electrons do not jump into the poly wiring layer 33. Thus, electrons can be made difficult to cross the potential barrier and generation of substrate hot electrons is suppressed.

A potential VN-well of the island N-well layer 36 will be described. Assuming that a capacitor of the insulating layer 32 is denoted by Cox and capacitance between the N-well/P substrate is denoted by Cpn, VN-well=24 V*Cox/(Cox+ Cpn). Here, if the concentration of the P substrate 31 is low, that is, the concentration of the P substrate 31<<the concentration of the island N-well layer 36, Cox>>Cpn. Therefore, the potential VN-well≈24 V, which is almost no voltage difference from 24 V of the poly wiring layer 33, and so almost no voltage is applied to the insulating layer 32. When the layer thickness or concentration of the island N-well layer 36 is made larger than necessary, however, the capacitance Cpn becomes larger, that is, Cox/(Cox+Cpn) becomes smaller than one, thereby the potential VN-well is also decreased and the effect is also reduced.

Second Application Example

A second application example uses the semiconductor wiring according to the embodiment as a resistor element. FIG. 9 shows an example of an output control circuit that performs feedback control.

The semiconductor wiring according to the embodiment allows a desired resistance value to be obtained by appropriately setting concentration of the impurities, length of the resistor element in the direction of flow of current, element cross-sectional area, and the like. In the application example, the semiconductor wiring is used as a resistor element. The resistor element causes a voltage drop corresponding to the resistance value to a signal being transmitted. The resistor element can be set to, for example, a resistance value of several tens kΩ. The second application example is an example in which the semiconductor wiring is used for resistors R1 and R2 as the resistor element.

The output control circuit includes the resistors R1 and R2 that branch off and obtain the output of the booster circuit 15 and detect a monitor potential, and an operation amplifier Ml that performs control so as to eliminate a difference between the detected monitor potential and a reference potential.

The resistors R1 and R2 of the output control circuit are connected in series and detect a voltage applied to a connection point between the resistor R1 and resistor R2 as the monitor potential. In the example, a voltage division ratio of the resistors R1 and R2 is set so that the monitor voltage becomes the same potential as the reference voltage.

The booster circuit 15 outputs, for example, the output signal of the high voltage of 24 V as described before. For this reason, the same output signal is also applied to a voltage dividing resistance line as well as an output line to which the output signal of the boosted potential is transmitted. Therefore, in the voltage dividing resistance line composed of the resistors R1 and R2, if a semiconductor wiring (poly wiring) having a conventional structure is used, the above-described substrate hot electrons occur and the resistance values of the resistors R1 and R2 fluctuate including individual different increase. The fluctuation of the resistance values also varies the voltage division ratio of the resistors R1 and R2, and also has an impact on the monitor potential. If the monitor voltage inappropriately fluctuates, the output of the booster circuit 15 is made unstable. Therefore, the semiconductor wiring (poly layer+insulating layer+floating N-type layer) is used as resistance elements for the resistors R1 and R2 so that the resistance values do not fluctuate due to the generation of substrate hot electrons. When the poly layer is used as a resistor, it causes a voltage drop in its layer, causing regions from a high voltage to a low voltage to exist.

The floating N-type layer is more effective if it is placed just under the high voltage region. A similar effect is obtained if the floating N-type layer of the high voltage region is separated from the floating N-type layer of the low voltage region.

In order to use such a semiconductor wiring as a resistor element, it is necessary to have a thickness by which the electric field applied to the insulating layer does not exceed 5-6 MV/cm as described before. For example, if the high voltage is 24 V, the layer thickness of the insulating layer is set to a thickness of 40 nm or more. The floating N-type layer preferably has an impurity concentration of 10 or more times of the P substrate, and has a thickness by which the depletion layer does not reach the insulating layer when a maximum voltage is applied.

According to the second application example, by using the semiconductor wiring including the floating N-type layer as a resistor element, when a high voltage is applied, the generation of substrate hot electrons is prevented and thereby the fluctuation of the resistance value can be suppressed. By suppressing the fluctuation of the resistance value of the resistor element used as a circuit element, deterioration in operation and characteristic of the circuit element is prevented, and desired performance can be maintained. An increase in power consumption due to the fluctuation of the resistance value can be prevented, and one cause of heat generation can be prevented.

Furthermore, the semiconductor wiring of the embodiment described as the second application example is not only used as the resistor element, but also it is preferable for a circuit element and wiring to which a high voltage is applied, and can be applied to, for example, a NOR-type memory circuit and a CMOS circuit.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device, comprising:
a memory cell array having a plurality of memory cells each connected to a word line and a bit line;
a booster circuit configured to supply a write voltage to the word line; and a semiconductor wiring provided in the booster circuit, wherein the semiconductor wiring includes:
a first semiconductor region of a first conductivity type;
a floating layer provided in the first semiconductor region, and including impurities of a second conductivity type;
an insulating layer formed on at least an entire upper surface of the floating layer and an upper surface of the first semiconductor region around the floating layer; and
at least one semiconductor wiring layer provided on the insulating layer, and facing the floating layer via the insulating layer, the semiconductor wiring layer having a capacitive coupling with the floating layer via the insulating layer,
wherein the insulating layer directly faces the first semiconductor region and the floating layer.

2. The memory device according to claim 1, wherein when the first conductivity type is a P type, the floating layer is an N-type semiconductor layer or N-well layer of the second conductivity type.

3. The memory device according to claim 1, wherein a width of the floating layer is equal to or less than a width of the semiconductor wiring layer.

4. The memory device according to claim 1, wherein when the floating layer has a rectangular cross-sectional shape, the floating layer is formed facing at least one surface of the semiconductor wiring layer.

5. The memory device according to claim 1, wherein the semiconductor wiring layer is formed of a semiconductor material including poly silicon.

6. The semiconductor device according to claim 1, wherein the write voltage is a voltage for writing information in a memory cell array.

7. The semiconductor device according to claim 1, wherein the floating layer forms an island impurity layer in a charged up state by an arbitrary voltage being applied to a floating potential from an outside.

8. The semiconductor device according to claim 1, wherein the floating layer has impurities of a pentavalent element containing phosphorus (P) or arsenic (As) introduced.

9. The semiconductor device according to claim 1, wherein the insulating layer has a thickness that suppresses a tunnel current by preventing an electric field generated by the write voltage applied to the semiconductor wiring layer from exceeding 5-6 MV/cm.

10. The semiconductor device according to claim 1, wherein the insulating layer has a thickness of 40 nm or more.

11. The semiconductor device according to claim 1, wherein the semiconductor wiring layer is used in the semiconductor wiring in combination with a metal wiring.

12. The semiconductor device according to claim 1, wherein
the booster circuit includes:
a first diode including a first anode and a first cathode, the first anode electrically connected to a supply terminal of an outside voltage;
a second diode including a second anode and a second cathode, the second anode electrically connected to the first cathode;
a third diode including a third anode and a third cathode, the third anode electrically connected to the second cathode, and the third cathode electrically connected to the semiconductor wiring;

a first capacitor including a first node and second node, the first node electrically connected to the first cathode and the second anode, and the second node supplied with a clock signal; and a second capacitor including a third node and a fourth node, the third node electrically connected to the second cathode and the third anode, and the fourth node supplied with an inverted clock signal.

13. The semiconductor device according to claim 1, further comprising:

an operation amplifier including a first input node supplied with a monitor potential, a second input node supplied with a reference potential, and an output node electrically connected to a supply terminal of the booster circuit;

a first resistor including a fifth node and a sixth node, the fifth node electrically connected to an output terminal of the booster circuit, and the sixth node electrically connected to the first input node; and a second resistor including a seventh node and an eighth node, the seventh node electrically connected to the sixth node and first input node, and the eighth node electrically connected to a ground terminal, wherein at least one of the first and second resistors includes the semiconductor wiring layer.

14. The memory device according to claim 1, wherein a center of a cross section of the semiconductor wiring layer along a short side direction is above the floating layer.

15. The memory device according to claim 1, wherein the semiconductor wiring is provided in an output terminal of the booster circuit.

16. The memory device according to claim 1, wherein one end of the semiconductor wiring is connected to the word line.

* * * * *